United States Patent
Asami et al.

(10) Patent No.: US 7,821,432 B2
(45) Date of Patent: Oct. 26, 2010

(54) ANALOG DIGITAL CONVERT APPARATUS, ANALOG DIGITAL CONVERT METHOD, CONTROL APPARATUS AND PROGRAM

(75) Inventors: Koji Asami, Saitama (JP); Haruo Kobayashi, Gunma (JP); Tetsuya Taura, Gunma (JP); Takahide Suzuki, Gunma (JP); Hiroyuki Miyajima, Gunma (JP)

(73) Assignee: Advantest Corporation, Tokyo (JP)

( * ) Notice: Subject to any disclaimer, the term of this patent is extended or adjusted under 35 U.S.C. 154(b) by 31 days.

(21) Appl. No.: 12/344,286

(22) Filed: Dec. 26, 2008

(65) Prior Publication Data

US 2010/0060495 A1 Mar. 11, 2010

(30) Foreign Application Priority Data

Dec. 27, 2007 (JP) ............................. 2007-338228

(51) Int. Cl.
*H03M 1/06* (2006.01)
(52) U.S. Cl. .................. 341/118; 341/120; 341/155
(58) Field of Classification Search ................. 341/118, 341/120, 155

See application file for complete search history.

(56) References Cited

U.S. PATENT DOCUMENTS

| | | | | |
|---|---|---|---|---|
| 6,522,282 B1 * | 2/2003 | Elbornsson | .................. | 341/155 |
| 6,809,668 B2 * | 10/2004 | Asami | ......................... | 341/120 |
| 7,394,415 B2 * | 7/2008 | Fuse et al. | ................... | 341/120 |
| 7,471,221 B2 * | 12/2008 | Asami | ......................... | 341/122 |
| 7,482,956 B2 * | 1/2009 | Huang et al. | ................. | 341/120 |

FOREIGN PATENT DOCUMENTS

JP      2005-347967      12/2005

\* cited by examiner

*Primary Examiner*—Khai M Nguyen
(74) *Attorney, Agent, or Firm*—Jianq Chyun IP Office

(57) ABSTRACT

Provided is an AD converting apparatus that converts an analog input signal into a digital output signal, comprising a plurality of AD converters supplied with sampling clocks differing from each other by prescribed phase amounts, each AD converter outputting an individual signal obtained by digitizing the input signal according to the supplied sampling clock; a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and a combining section that generates the output signal by combining a plurality of the corrected individual signals.

16 Claims, 12 Drawing Sheets

ANALOG DIGITAL CONVERT APPARATUS, ANALOG DIGITAL CONVERT METHOD, CONTROL APPARATUS AND PROGRAM

CROSS REFERENCE TO RELATED APPLICATION

The present application claims priority from a Japanese Patent application No. 2007-338228 filed on Dec. 27, 2007, the contents of which are incorporated herein by reference.

BACKGROUND

1. Technical Field

The present invention relates to an AD converting apparatus, an AD converting method, a control apparatus, and a program. In particular, the present invention relates to an AD converting apparatus, an AD converting method, a control apparatus, and a program for converting an analog input signal into a digital output signal using a plurality of AD converters.

2. Related Art

An interleave-type AD converting apparatus with a high sampling rate is known as in, for example, Japanese Patent Application Publication No. 2005-347967. The interleave-type AD converting apparatus is provided with a plurality of AD converters that are supplied with sampling clocks that differ from each other by a prescribed phase, and a combining section that sequentially selects one sample at a time of the signals output by the AD converters and combines these sampled signals.

The AD converting apparatus described above corrects each of a plurality of signals output by a plurality of AD converters, where each signal is corrected according to a frequency characteristic of the corresponding AD converter. In this way, the AD converting apparatus can accurately convert an analog input signal into a digital output signal, even when each AD converter has a different frequency characteristic.

However, each AD converter has an error that causes a curve representing the relation between the amplitude of the input signal and the data value of the AD-converted output signal to deviate from the ideal curve, e.g. a straight line. The characteristic that causes the curve representing the relation between the amplitude of the input signal and the data value of the AD-converted output signal to deviate from the ideal curve is known as the "non-linear characteristic." An interleave-type AD converting apparatus causes spurious components to be included in the output signal when the AD converters have different non-linear characteristics, and this decreases the dynamic range of the output signal.

SUMMARY

Therefore, it is an object of an aspect of the innovations herein to provide an AD converting apparatus, an AD converting method, a control apparatus, and a program, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary AD converting apparatus may include an AD converting apparatus that converts an analog input signal into a digital output signal, comprising a plurality of AD converters supplied with sampling clocks differing from each other by prescribed phase amounts, each AD converter outputting an individual signal obtained by digitizing the input signal according to the supplied sampling clock; a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and a combining section that generates the output signal by combining a plurality of the corrected individual signals.

According to a second aspect related to the innovations herein, one exemplary AD converting method may include an AD converting method that uses a plurality of AD converters to convert an analog input signal into a digital output signal, comprising supplying the plurality of AD converters with sampling clocks differing from each other by prescribed phase amounts, and causing each AD converter to output an individual signal obtained by digitizing the input signal according to the supplied sampling clock; generating a corrected individual signal for each AD converter by correcting the individual signal output by the AD converter using a correction factor corresponding to an amplitude of the individual signal; and generating the output signal by combining a plurality of the generated corrected individual signals.

According to a third aspect related to the innovations herein, one exemplary control apparatus may include a control apparatus that uses a plurality of AD converters to function as an AD converting apparatus that converts an analog input signal into a digital output signal, comprising a clock output section that supplies the plurality of AD converters with sampling clocks differing from each other by prescribed phase amounts, causing each AD converter to output an individual signal obtained by digitizing the input signal according to the supplied sampling clock; a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and a combining section that generates the output signal by combining a plurality of the corrected individual signals.

According to a fourth aspect related to the innovations herein, one exemplary program may include a program that causes a control apparatus to function as an AD converting apparatus that uses a plurality of AD converters to convert an analog input signal into a digital output signal, the program causing the control apparatus to function as a clock output section that supplies the plurality of AD converters with sampling clocks differing from each other by prescribed phase amounts, causing each AD converter to output an individual signal obtained by digitizing the input signal according to the supplied sampling clock; a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and a combining section that generates the output signal by combining a plurality of the corrected individual signals.

The summary clause does not necessarily describe all necessary features of the embodiments of the present invention. The present invention may also be a sub-combination of the features described above. The above and other features and

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
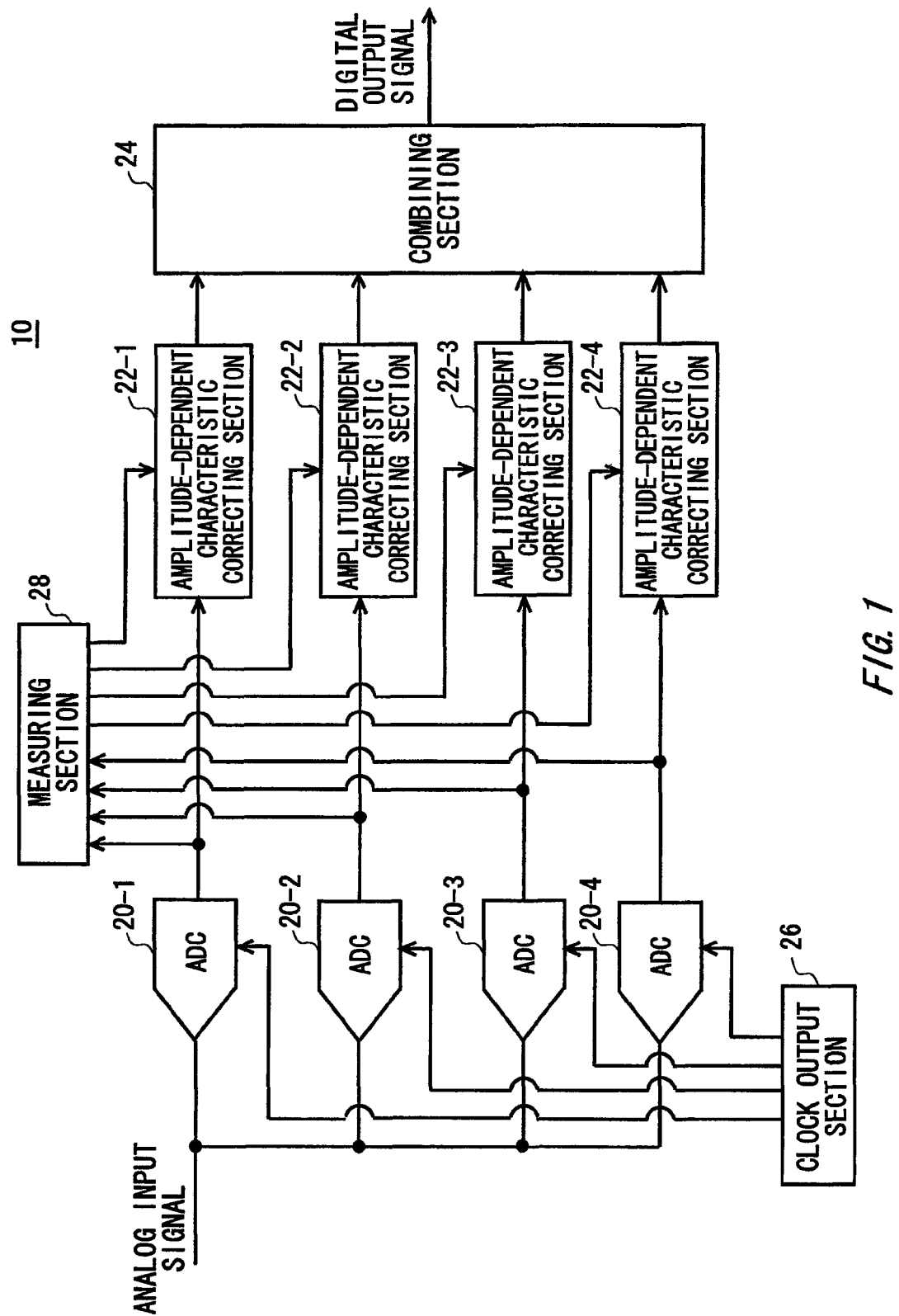
FIG. 1 shows an exemplary configuration of an AD converting apparatus 10 according to an embodiment of the present invention.

FIG. 1 shows an exemplary configuration of an AD converting apparatus 10 according to an embodiment of the present invention. The AD converting apparatus 10 converts an analog input signal into a digital output signal. The AD converting apparatus 10 is provided with a plurality of AD converters 20 (in the present embodiment there are four AD converters 20-1 to 20-4), a plurality of amplitude-dependent characteristic correcting sections 22 (in the present embodiment there are four amplitude-dependent characteristic correcting sections 22-1 to 22-4), a combining section 24, a clock output section 26, and a measuring section 28.

Each AD converter 20 is supplied with an input signal to be AD converted. Each AD converter 20 is supplied with a sampling clock, the phase of which differs by a prescribed amount for each AD converter 20. The sampling clock is described in detail in FIG. 2. Each AD converter 20 samples the analog input signal according to the sampling clock supplied thereto, and outputs a digitized individual signal.

The plurality of amplitude-dependent characteristic correcting sections 22 are provided to correspond respectively to the plurality of AD converters 20. Each amplitude-dependent characteristic correcting section 22 generates a corrected individual signal by correcting the individual signal output by the corresponding AD converter 20 using a correction factor based on the amplitude of the individual signal.

For example, each amplitude-dependent characteristic correcting section 22 corrects the individual signal output by the corresponding AD converter 20 such that the corrected individual signal approaches a reference value, e.g. such that the corrected individual signal matches a reference value. The reference value may be a data value that should be output when a reference AD converter AD converts the analog input signal. The reference AD converter may cause the amplitude of the input signal and the data value of the output signal to have an ideal linear relationship. As another example, the reference AD converter may cause the amplitude of the input signal and the data value of the output signal to have a non-linear relationship, e.g. the reference AD converter may be any one of the AD converters 20 provided to the AD converting apparatus 10.

Each amplitude-dependent characteristic correcting section 22 may perform the correction by multiplying the individual signal output from the corresponding AD converter 20 by the correction factor based on an inverse characteristic of a non-linear characteristic of the AD converter 20. Here, the non-linear characteristic indicates the ratio of the individual signal output from the AD converter 20 to a signal expected to be output by the reference AD converter.

Each amplitude-dependent characteristic correcting section 22 may acquire, in advance, a function expressing the inverse of the non-linear characteristic of the corresponding AD converter 20, where the amplitude of the individual signal is a variable in the function. Each amplitude-dependent characteristic correcting section 22 may use, as the correction factor, a result obtained by substituting the amplitude of the individual signal output by the corresponding AD converter 20 into the function.

Each amplitude-dependent characteristic correcting section 22 may store, in advance, the correction factor for each amplitude of the individual signal in a table or the like. In this case, each amplitude-dependent characteristic correcting section 22 may select one correction factor from the table that is associated with the amplitude of the individual signal output by the corresponding AD converter 20, and correct the individual signal using the selected correction factor.

The combining section 24 generates an output signal by combining the plurality of corrected individual signals output by the plurality of amplitude-dependent characteristic correcting sections 22. More specifically, the combining section 24 may generate a single data sequence by sequentially selecting, cyclically for each sample, the corrected individual signals output by the amplitude-dependent characteristic correcting sections 22. The combining section 24 selects the corrected individual signals sequentially, beginning with the AD converter 20 supplied with the sampling clock having the earliest phase. The combining section 24 outputs the generated data sequence as the output signal.

After combining the plurality of corrected individual signals corrected to have a characteristic matching that of a certain AD converter, the combining section 24 may correct each data value in the output signal to be equal to an ideal value. For example, the combining section 24 may correct each data value in the output signal to be equal to an ideal value by performing, on the combined signal, the process performed by the amplitude-dependent characteristic correcting sections 22. In this way, the combining section 24 can cause the relation between the amplitude of the input signal and the data value of the output signal to have the ideal direct relationship, even when the amplitude-dependent characteristic correcting sections 22 output corrected individual signals that are corrected with data values output by non-ideal AD converters.

The clock output section 26 supplies each AD converter 20 with a sampling clock, each sampling clock having the same frequency and a phase differing by a prescribed amount. In this way, the clock output section 26 can cause the AD converters 20 to output digitized individual signals by causing the AD converters 20 to sample the input signal at timings shifted relative to each other by a prescribed amount but having the same frequency.

The measuring section 28 measures in advance the characteristic of the individual signal of a single AD converter 20 output for each amplitude of the input signal. The measuring section 28 then generates a correction factor corresponding to the single AD converter 20, based on the measurement result, and supplies this correction factor to the corresponding amplitude-dependent characteristic correcting section 22. For example, the measuring section 28 supplies a predetermined analog measurement signal instead of the input signal to each AD converter 20, and measures the individual signal output by each AD converter 20. The AD converter 20 may then calculate the non-linear characteristic of each AD converter 20 based on the measurement results, and generate correction factors based on the calculated non-linear characteristics. The measuring section 28 can set the correction factor in each amplitude-dependent characteristic correcting section 22 during manufacturing or during calibration.

The AD converting apparatus 10 need not be provided with the measuring section 28. In this case, the AD converting apparatus 10 may use an external measuring device to measure in advance the characteristic of the individual signal output by each AD converter 20 for each amplitude of the input signal, and may set a correction factor in each amplitude-dependent characteristic correcting section 22 from an external section.

The AD converting apparatus 10 described above can eliminate spurious components included in the output signal, even when the plurality of AD converters 20 have different non-linear characteristics. In this way, the AD converting apparatus 10 can widen the dynamic range of the output signal.

Figure 2:
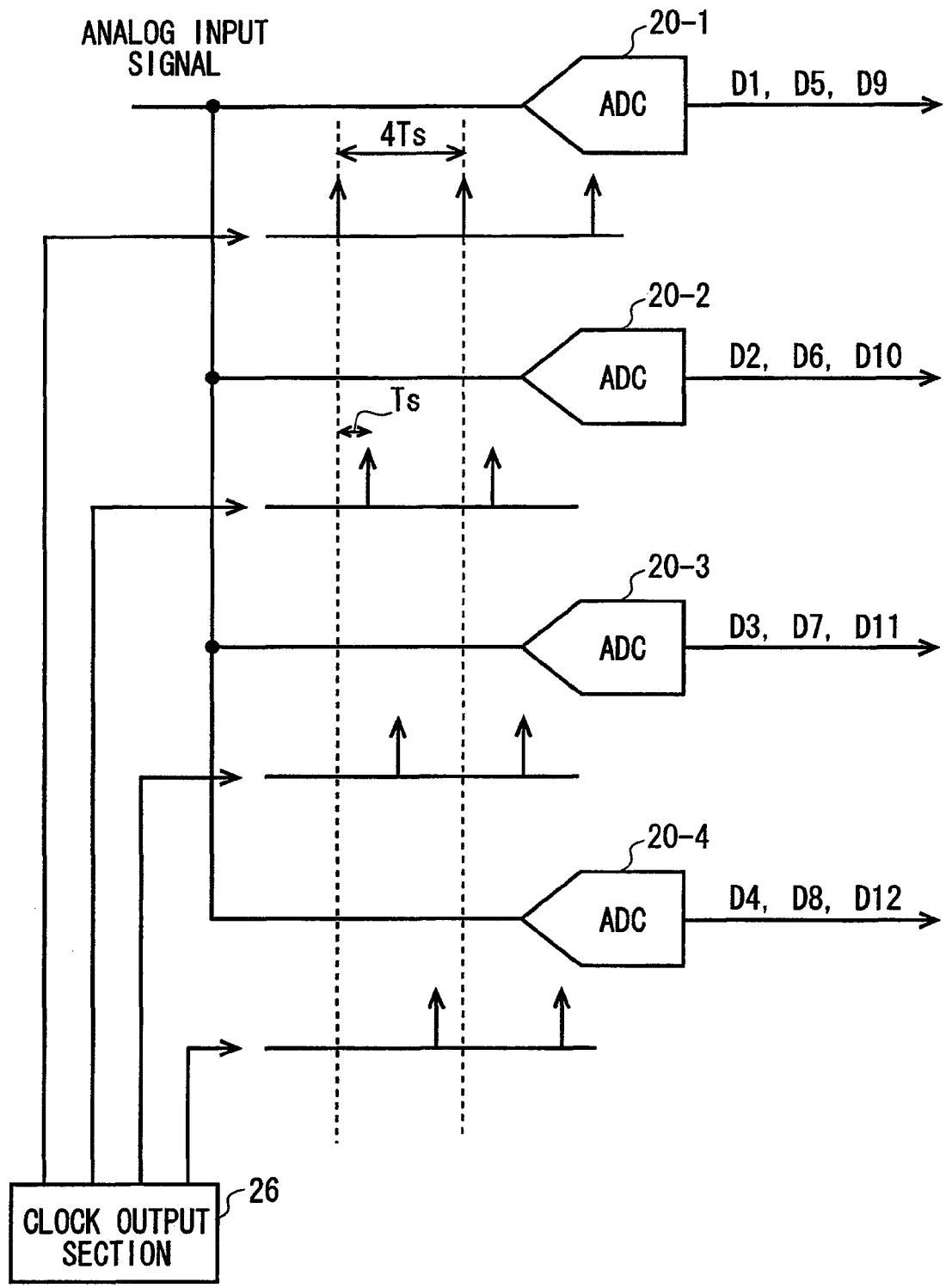
FIG. 2 shows an exemplary sampling clock provided to each AD converter 20.

FIG. 2 shows an exemplary sampling clock provided to each AD converter 20. If the AD converting apparatus 10 is provided with N AD converters, where N is an integer greater than 1, the clock output section 26 supplies the sampling clock with a phase of (N×Ts) to each of the N AD converters 20, such that the phase of the sampling clock changes by Ts for each AD converter 20. In the present embodiment, the AD converting apparatus 10 is provided with four AD converters 20, and therefore the clock output section 26 generates a sampling clock with a phase of 4×Ts obtained by changing the phases by the time Ts in relation to each other. In this way, the AD converting apparatus 10 can output an output signal at a rate N times that of the sampling clock.

Figure 3:
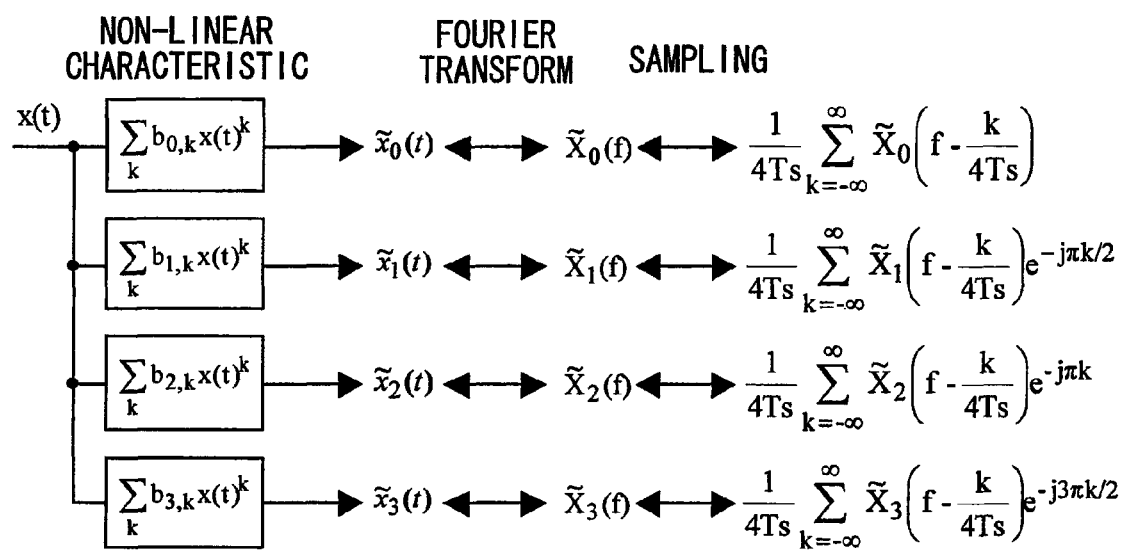
FIG. 3 describes the effect that an error in the non-linear characteristic of each AD converter 20 has on the output signal of the AD converting apparatus 10.

FIG. 3 describes the effect that an error in the non-linear characteristic of each AD converter 20 has on the output signal of the AD converting apparatus 10. The input signal input into each AD converter 20 is represented by x(t). A signal obtained by adding the effect on the non-linearity of one of the AD converters 20 to the input signal x(t) is defined below in Expression 1. A result obtained by performing a Fourier transform on the signal obtained by adding the effect on the non-linearity of one of the AD converters 20 to the input signal x(t) is defined as the signal expressed by the right-hand portion of Expression 2.

$$\tilde{x}_m(t) = \sum_k b_{m,k} x(t)^k \quad (1)$$

$$\tilde{x}_m(t) \Leftrightarrow \tilde{X}_m(f) \quad (2)$$

Here, t represents time, m is a value designating one of the AD converters 20 and can be an integer greater than or equal to 0 and less than or equal to N−1, $b_{m,k}$ represents a k-th order non-linear characteristic in one of the AD converters 20, and k represents an order.

One of the AD converters 20 samples the signal expressed by the right-hand side of Expression 2 using a sampling clock with a period of N×Ts that has a phase shifted by m×(2π/N). Accordingly, the individual signal output by the one AD converter 20 can be expressed by Expression 3.

$$\tilde{X}_m(f) = \frac{1}{N \cdot T_S} \sum_{k=-\infty}^{\infty} \tilde{X}_m\left(f - \frac{k}{N \cdot T_S}\right) e^{-j2\pi mk/N} \quad (3)$$

The AD converting apparatus 10 outputs a signal obtained by combining a plurality of individual signals output from the plurality of AD converters 20. The signal obtained by combining the plurality of individual signals output from the plurality of AD converters 20 can be calculated by adding together the signal expressed by Expression 3 from m=0 to m=(N−1). For example, a signal obtained by combining the signals output from four AD converters 20 can be expressed by Expression 4. From Expression 4 it is understood that, when each AD converter 20 has a different non-linear characteristic, the signal obtained by combining the plurality of individual signals output by the plurality of AD converters 20 includes an image component, e.g. a spurious component or a spurious alias component, at each 1/N periods of the apparent sampling clock, which is Ts/4 periods in the case of Expression 4.

$$\tilde{X}(f) = \frac{1}{4T_S} \sum_{k=-\infty}^{\infty} \left[ \begin{array}{l} \tilde{X}_0\left(f - \frac{k}{4T_S}\right) + \tilde{X}_1\left(f - \frac{k}{4T_S}\right)e^{-j\pi k/2} + \\ \tilde{X}_2\left(f - \frac{k}{4T_S}\right)e^{-j\pi k} + \tilde{X}_3\left(f - \frac{k}{4T_S}\right)e^{-j3\pi k/2} \end{array} \right] \quad (4)$$

Here, if the non-linear characteristic of each AD converter 20 is the same, each signal obtained by adding the effect of the non-linear characteristic of one of the AD converters 20 to the input signal x(t) is the same, as shown in Expression 5.

$$\tilde{X}_1(f) = \tilde{X}_2(f) = \tilde{X}_3(f) = \tilde{X}_4(f) = \tilde{X}_n(f) = \tilde{X}(f) \quad (5)$$

When Expression 5 is substituted into Expression 4, the exponential terms cancel out, resulting in Expression 6. In this way, when the non-linear characteristic of each AD converter 20 is the same, it can be seen from the signal obtained by combining the plurality of individual signals output by the plurality of AD converters 20 that the image components at each period of 1/N in the apparent sampling clock are eliminated.

$$\tilde{X}(f) = \frac{1}{T_S} \sum_{k=-\infty}^{\infty} \tilde{X}\left(f - \frac{k}{T_S}\right) \qquad (6)$$

The AD converting apparatus 10 combines the individual signals output by the AD converters 20 after multiplying each individual signal by a correction factor corresponding to the inverse of the non-linear characteristic. In other words, the output signal of the AD converting apparatus 10 is the same as a signal obtained by combining individual signals output from AD converters 20 having the same non-linear characteristics. Accordingly, the AD converting apparatus 10 can output a signal that does not include the spurious components, in the same way as shown by Expression 6.

Figure 4:
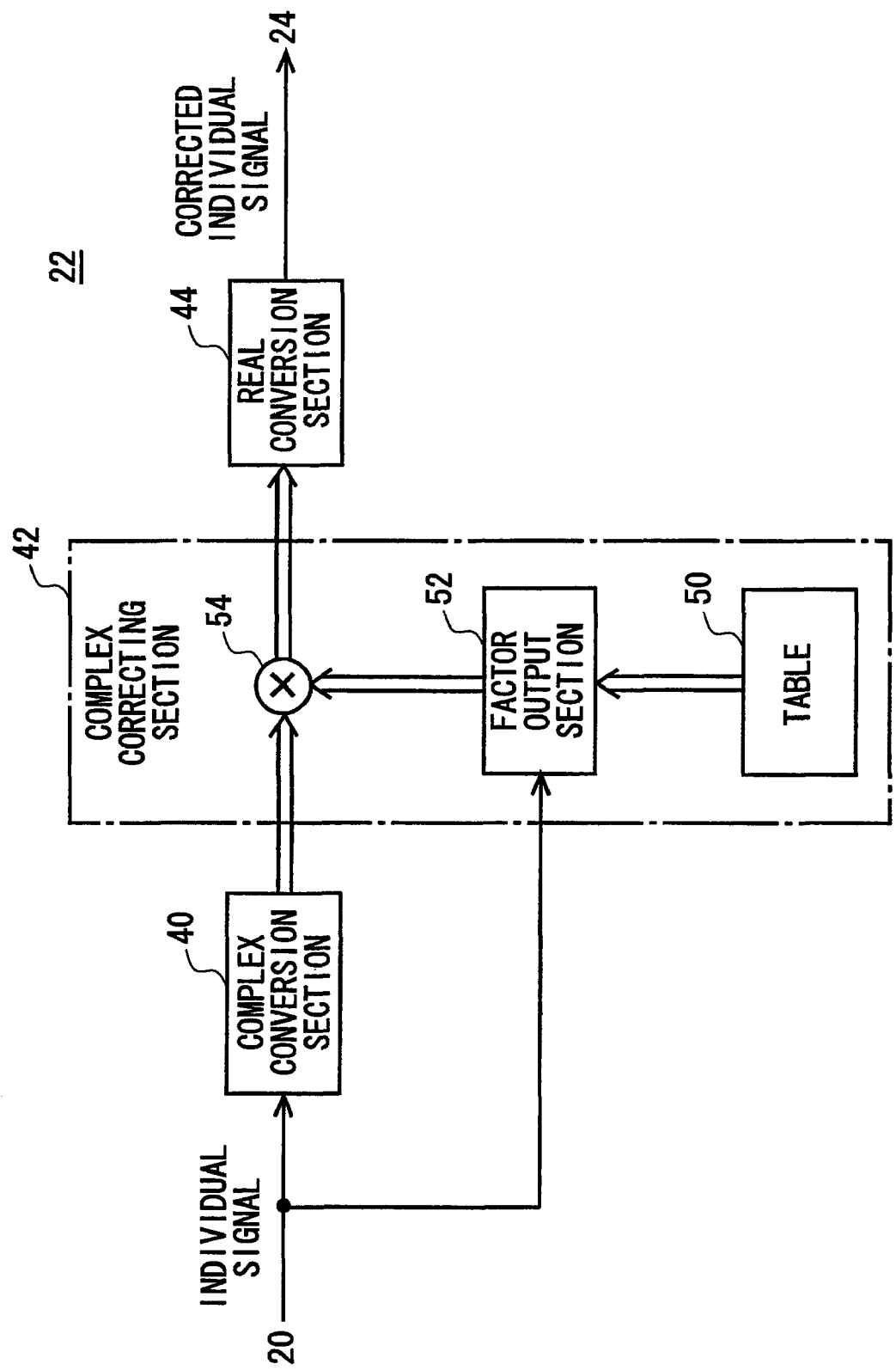
FIG. 4 shows an exemplary configuration of one of the plurality of amplitude-dependent characteristic correcting sections 22 according to the present embodiment.

FIG. 4 shows an exemplary configuration of one of the plurality of amplitude-dependent characteristic correcting sections 22 according to the present embodiment. The amplitude-dependent characteristic correcting section 22 may include a complex conversion section 40, a complex correcting section 42, and a real conversion section 44.

The complex conversion section 40 converts the individual signal output by the corresponding AD converter 20 into a complex individual signal represented by a complex number. For example, the complex conversion section 40 may use a Hilbert transformation to convert the individual signal expressed as a real number into the complex individual signal expressed as a complex number.

The complex correcting section 42 corrects the complex individual signal using a correction factor expressed as a complex number to generate a complex corrected individual signal. The complex correcting section 42 may include a table 50, a factor output section 52, and a complex multiplying section 54.

The table 50 stores a correction factor for each amplitude of the individual signal. The table 50 may store a correction factor corresponding to the inverse of the non-linear characteristic of the corresponding AD converter 20, in association with an amplitude of the individual signal. In this case, the non-linear characteristic of the AD converter 20 may be a characteristic that expresses a ratio between (i) the phase and the amplitude of the complex individual signal resulting from the complex conversion of the individual signal output by the AD converter 20 and (ii) the phase and the amplitude of the signal resulting from the complex conversion of the signal output by the reference AD converter.

The factor output section 52 outputs the correction factor according to the amplitude of the individual signal output by the corresponding AD converter 20. More specifically, the factor output section 52 reads, from the table 50, the correction factor corresponding to the amplitude of the individual signal output by the AD converter 20, and supplies the correction factor to the complex multiplying section 54.

The complex multiplying section 54 performs a complex multiplication between the complex individual signal output by the complex conversion section 40 and the correction factor supplied from the factor output section 52. The complex multiplying section 54 then outputs the complex multiplication result as the complex corrected individual signal. In this way, the complex correcting section 42 can generate the complex corrected individual signal.

The real conversion section 44 converts the complex corrected individual signal output by the complex correcting section 42 into a corrected individual signal expressed as a real number. For example, the real conversion section 44 may use an inverse Hilbert transformation to convert the complex corrected individual signal expressed as a complex number into a corrected individual signal expressed as a real number.

The real conversion section 44 may instead use an FFT (Fast Fourier Transform) and an inverse FFT to convert the complex corrected individual signal into the corrected individual signal. In other words, the real conversion section 44 performs an FFT on the complex corrected individual signal. Next, the real conversion section 44 generates a reflection component, which is a component obtained by reflecting a complex conjugate of the FFT result around a frequency of 0, and adds this reflection component to the FFT result. More specifically, the reflection component is obtained by converting the component at each positive frequency in the FFT result to a negative frequency such that the complex conjugate of each positive component has the same frequency and absolute value as each negative frequency component. The real conversion section 44 may then generate the corrected individual signal by performing an inverse FFT on a result obtained by adding together the FFT result and the reflection component.

The amplitude-dependent characteristic correcting section 22 described above can more accurately correct the individual signal output by the corresponding AD converter 20, even when the phase and amplitude of the individual signal changes according to the amplitude of the input signal. In this way, the AD converting apparatus 10 can more accurately eliminate the spurious components included in the output signal.

Figure 5A:
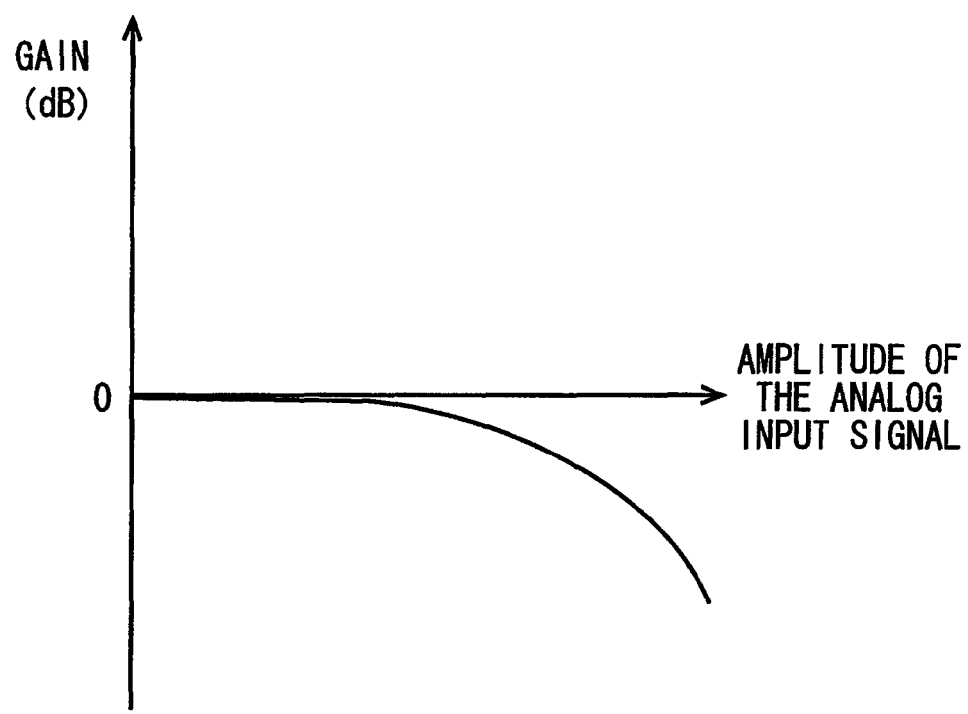
FIG. 5A shows an example of a non-linear characteristic, i.e. an amplitude component, of an AD converter 20.
Figure 5B:
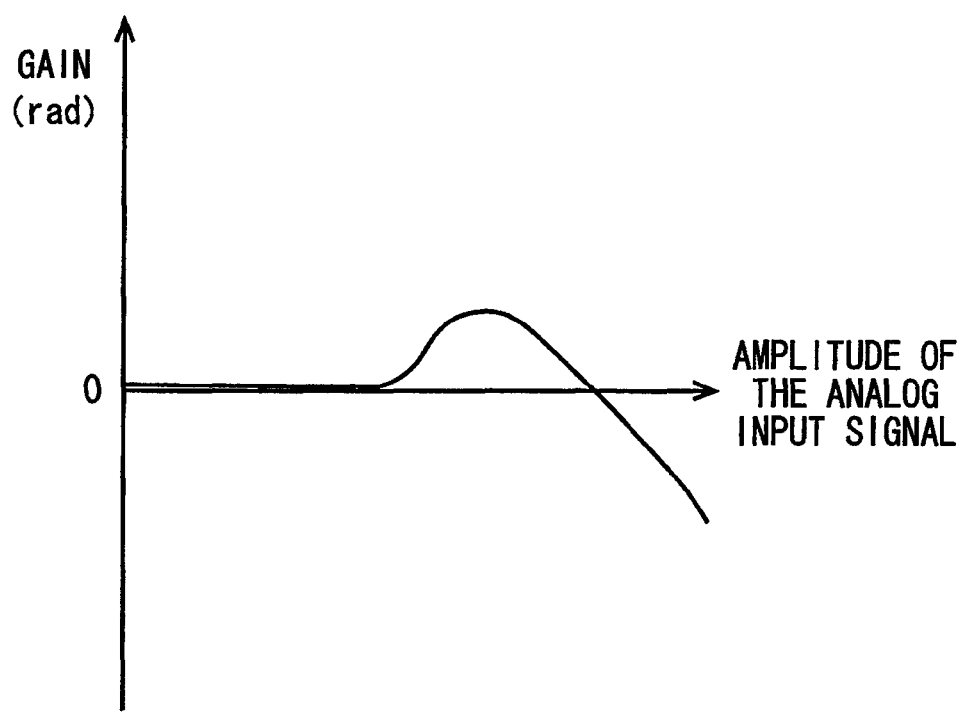
FIG. 5B shows an example of a non-linear characteristic, i.e. a phase component, of an AD converter 20.

FIG. 5A shows an example of a non-linear characteristic, i.e. an amplitude component, of an AD converter 20. FIG. 5B shows an example of a non-linear characteristic, i.e. a phase component, of an AD converter 20.

The measuring section 28 may calculate the amplitude component and the phase component non-linear characteristics by measuring, for each AD converter 20, the amplitude and phase of the complex individual signal corresponding to each amplitude of the input signal. For example, the measuring section 28 calculates the amplitude component and the phase component non-linear characteristics based on a measurement result obtained by supplying each AD converter 20 with a measurement signal having a changing amplitude, e.g. a triangular wave or a sinusoidal wave, and measuring the phase change and amplitude change of the resulting complex individual signal.

The measuring section 28 may calculate a correction factor expressed as a complex number for each amplitude of the individual signal, according to an inverse of the non-linear characteristic, and store the correction factors in the table 50 shown in FIG. 4. In this way, the measuring section 28 can generate correction factors for correcting the complex individual signals.

Figure 6:
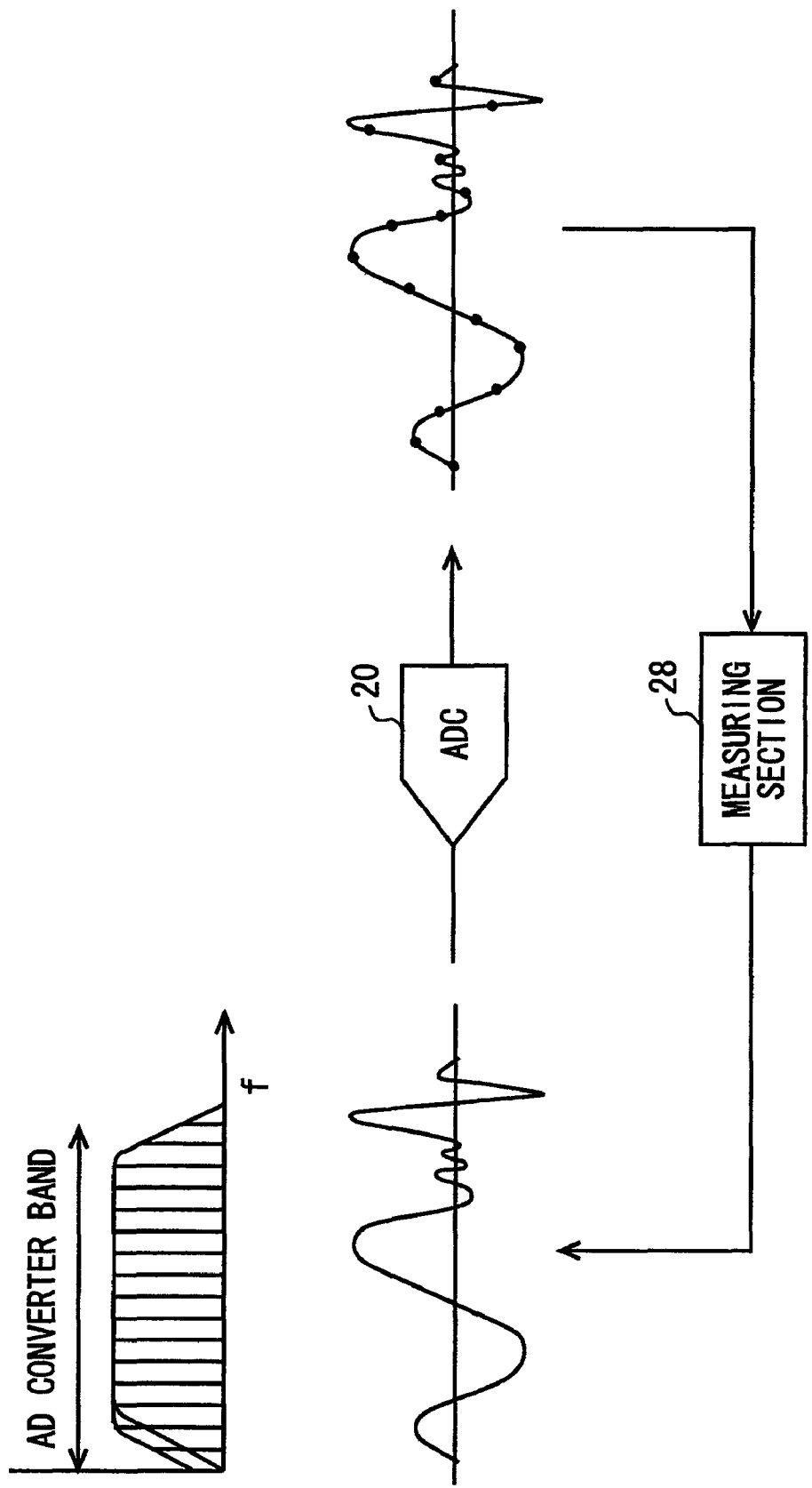
FIG. 6 shows an example of a measured signal supplied to an AD converter 20 for calculating a correction factor.

FIG. 6 shows an example of a measured signal supplied to an AD converter 20 for calculating a correction factor. For example, the measuring section 28 supplies the AD converter 20 with a predetermined measurement signal that includes a frequency component over the entire operational frequency band of the AD converter 20. In this way, the measuring section 28 can calculate the non-linear characteristic averaged over the entire operational frequency band of the AD converter 20.

Figure 7:
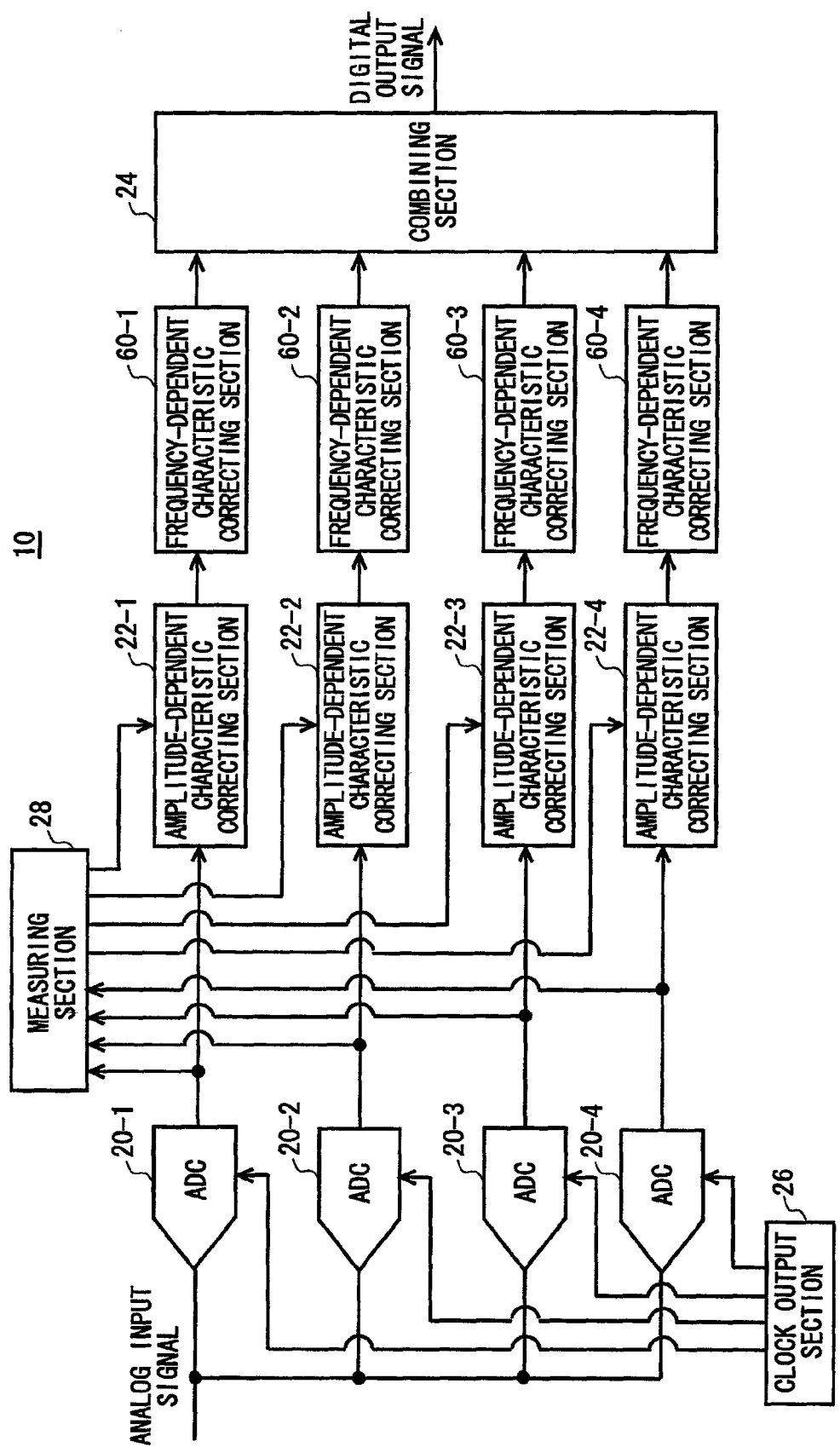
FIG. 7 shows a configuration of the AD converting apparatus 10 according to a first modification of the present embodiment.

FIG. 7 shows a configuration of the AD converting apparatus 10 according to a first modification of the present embodiment. Components in the AD converting apparatus 10 according to the present modification that have the same configuration and function as components of the AD converting apparatus 10 shown in FIG. 1 are given the same numerals, and the following description includes only differing points.

The AD converting apparatus 10 of the present modification is further provided with a plurality of frequency-dependent characteristic correcting sections 60, i.e. four frequency-dependent characteristic correcting sections 60-1 to 60-4. The plurality of frequency-dependent characteristic correcting sections 60 are provided to correspond to the plurality of AD converters 20. Each frequency-dependent characteristic correcting section 60 corrects the individual signal output by the corresponding AD converter 20, according to a frequency characteristic of the AD converter 20.

The plurality of frequency-dependent characteristic correcting sections 60 may correct the individual signal output by the corresponding AD converter 20 by using a technique disclosed in Japanese Patent Application Publication No. 2005-347967 (U.S. Pat. No. 3,947,185). In this case, the plurality of frequency-dependent characteristic correcting sections 60 perform a Fourier transform step and a correction step. In the Fourier transform step, each frequency-dependent characteristic correcting section 60 performs a Fourier transform on the data sampled by the corresponding AD converter 20 to generate a frequency domain signal. In the correcting step, each frequency-dependent characteristic correcting section 60 multiplies the frequency domain signal by a correction factor based on the frequency characteristics of all of the AD converters 20, to convert the frequency domain signal into a frequency domain signal acquired when the frequency characteristic of the corresponding AD converter 20 is ideal.

More specifically, in the correction step, the frequency-dependent characteristic correcting sections 60 begin by dividing the frequency band of the digital signal to be calculated according to the number of AD converters 20. Next, for each divided frequency band, the frequency-dependent characteristic correcting sections 60 calculate first correction factors based on the frequency characteristics of all of the AD converters 20. Each first correction factor, when multiplied by the corresponding frequency domain signal, causes the spurious components in the frequency domain signal caused by the frequency characteristic of the corresponding AD converter 20 to cancel out. Next, for each divided frequency band, the frequency-dependent characteristic correcting sections 60 calculate second correction factors based on the first correction factors and the frequency characteristics. Each second correction factor corrects an error in the phase of the signal component in the frequency domain signal that is caused by the multiplication by the first correction factor. The frequency-dependent characteristic correcting sections 60 then multiply each frequency domain signal by the corresponding first correction factor and the corresponding second correction factor.

In the present modification, the combining section 24 generates a frequency spectrum of the digital signal by combining each frequency domain signal obtained as a result of the correction step. In this way, the AD converting apparatus 10 according to the present modification can generate a frequency spectrum in which the spurious components are eliminated.

In the AD converting apparatus 10 of the present modification, the frequency-dependent characteristic correcting sections 60 may multiply the frequency domain signals by the corresponding first correction factors in the correction step, the combining section 24 may combine the resulting frequency domain signals, and the combined signal may then be multiplied by the second correction factor. In this order as well, the AD converting apparatus 10 according to the present modification can generate a frequency spectrum in which the spurious components are eliminated.

Each frequency-dependent characteristic correcting section 60 may be provided behind the corresponding amplitude-dependent characteristic correcting section 22. In other words, each frequency-dependent characteristic correcting section 60 may correct the corrected individual signal generated by the corresponding amplitude-dependent characteristic correcting section 22 according to the frequency characteristic of the corresponding AD converter 20. The combining section 24 may then generate the output signal by combining the plurality of corrected individual signals corrected by the plurality of frequency-dependent characteristic correcting sections 60, instead of the plurality of corrected individual signals generated by the plurality of amplitude-dependent characteristic correcting sections 22.

The AD converter is provided with a sample/hold circuit and a conversion processing section such as a DA converter and comparator. In the AD converter, the sample/hold circuit has a bigger impact than the conversion processing section on an error dependent on the frequency of the input signal. On the other hand, the conversion processing section has a bigger impact than the sample/hold circuit on an error dependent on the amplitude of the input signal.

Here, the sample/hold circuit is provided in front of the conversion processing section. In other words, the error dependent on the frequency of the input signal is added to the output signal of the AD converter first, and then the error dependent on the amplitude of the input signal is added. Therefore, when eliminating the errors from the output signal of the AD converter, the errors are desirably eliminated in the opposite direction, i.e. the error dependent on the amplitude of the input signal is eliminated first, and then the error dependent on the frequency of the input signal is eliminated. In this way, by providing the frequency-dependent characteristic correcting sections 60 behind the amplitude-dependent characteristic correcting sections 22, the AD converting apparatus 10 according to the present modification can efficiently eliminate the errors added by the AD converters 20.

Figure 8:
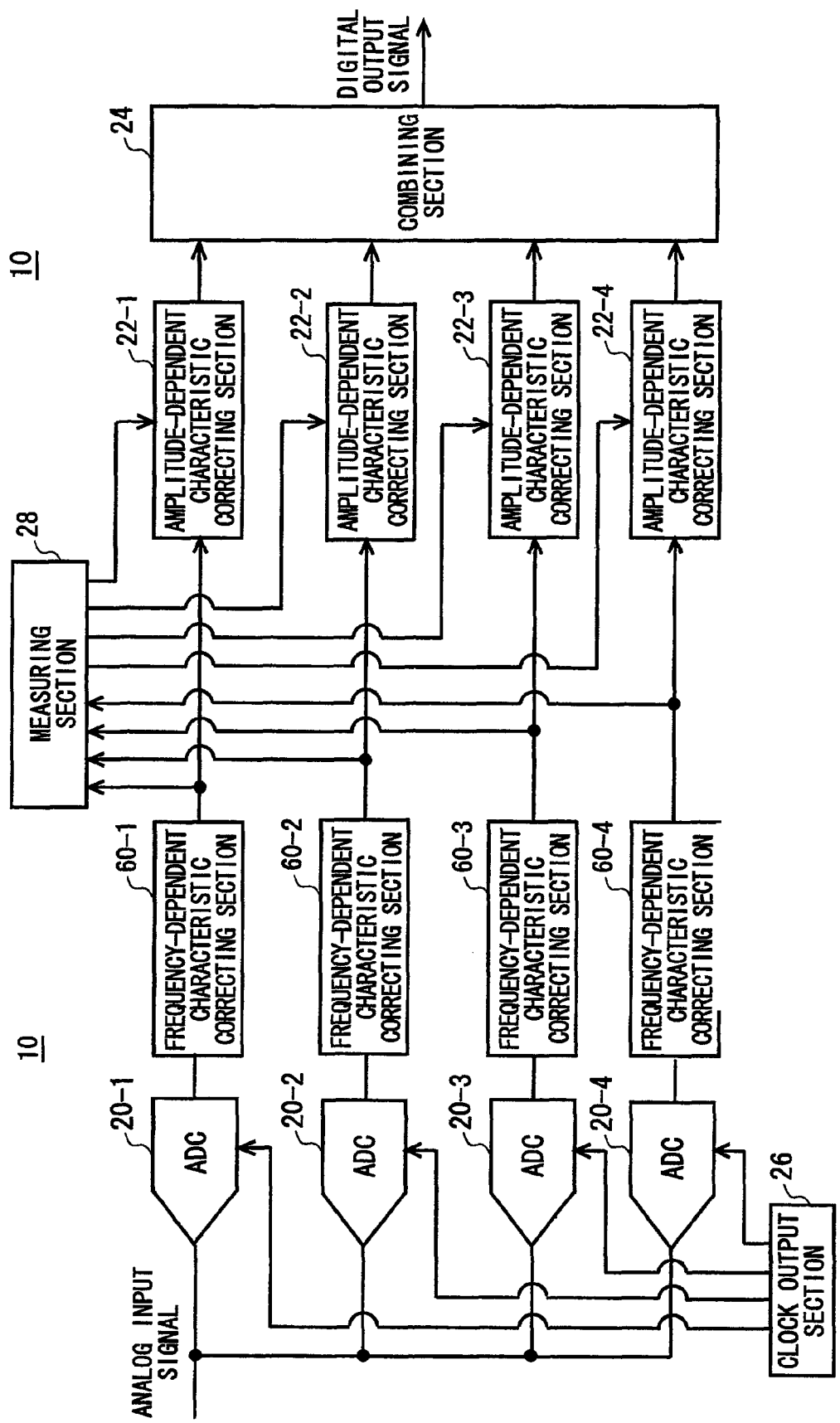
FIG. 8 shows a configuration of the AD converting apparatus 10 according to a second modification of the present embodiment.

FIG. 8 shows a configuration of the AD converting apparatus 10 according to a second modification of the present embodiment. Components in the AD converting apparatus 10 according to the present modification that have the same configuration and function as components of the AD converting apparatus 10 according to the first modification shown in FIG. 7 are given the same numerals, and the following description includes only differing points.

In the present modification, each frequency-dependent characteristic correcting section 60 is provided behind the corresponding AD converter 20, and in front of the corresponding amplitude-dependent characteristic correcting section 22. In other words, each frequency-dependent characteristic correcting section 60 corrects the individual signal output by the corresponding AD converter 20 according to the frequency characteristic of the AD converter 20. Then, each amplitude-dependent characteristic correcting section 22 generates the corrected individual signal by correcting the signal output by the corresponding frequency-dependent characteristic correcting section 60, instead of the individual signal output by the corresponding AD converter 20.

The AD converting apparatus 10 according to the present modification can generate a frequency spectrum in which the spurious components are eliminated. Furthermore, the AD converting apparatus 10 according to the present modification may be provided with a plurality of first frequency-dependent characteristic correcting sections 60 provided in front of the plurality of amplitude-dependent characteristic correcting sections 22 and a plurality of second frequency-dependent characteristic correcting sections 60 provided behind the plurality of amplitude-dependent characteristic correcting sections 22. In this way, the AD converting apparatus 10 according to the present modification can more accurately eliminate the spurious components.

Figure 9:
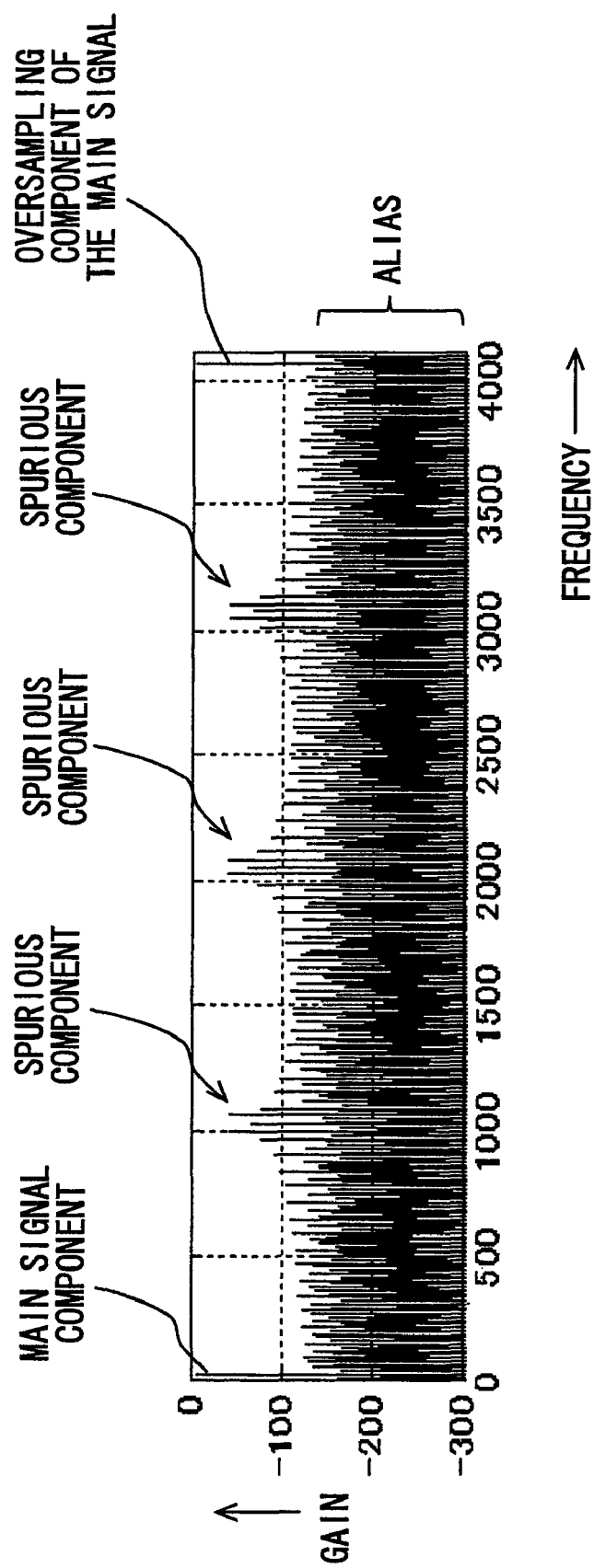
FIG. 9 shows the result of a simulation of a frequency characteristic of an output signal output by an interleave-type AD converting apparatus provided with four AD converters, when supplied with an input signal having a single frequency.
Figure 10:
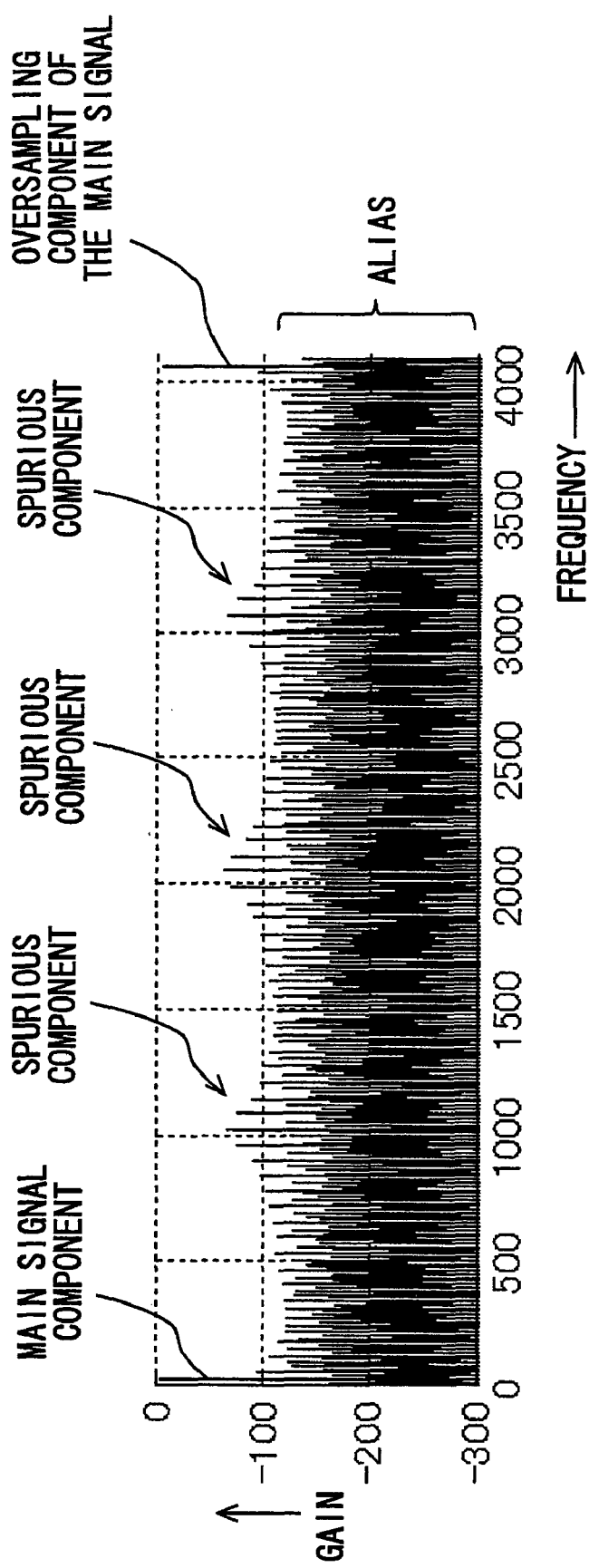
FIG. 10 shows the result of a simulation of a frequency characteristic of an output signal output by an interleave-type AD converting apparatus provided with four AD converters and four correcting sections that respectively correct the frequency characteristics of the four AD converters, when supplied with an input signal having a single frequency.
Figure 11:
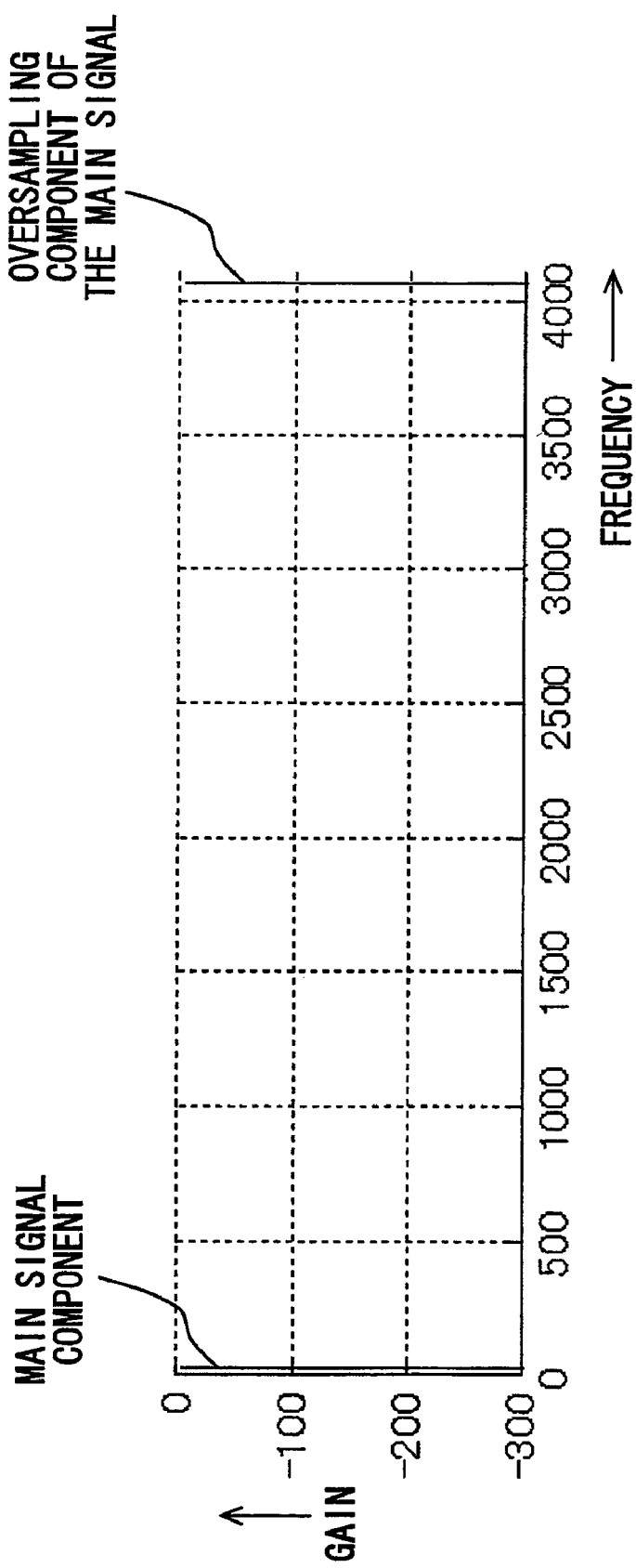
FIG. 11 shows the result of a simulation of a frequency characteristic of an output signal output by the AD converting apparatus 10 according to the modification shown in FIG. 7, when supplied with an input signal having a single frequency.

FIG. 9 shows the result of a simulation of a frequency characteristic of an output signal output by an interleave-type AD converting apparatus provided with four AD converters, when supplied with an input signal having a single frequency. FIG. 10 shows the result of a simulation of a frequency characteristic of an output signal output by an interleave-type AD converting apparatus provided with four AD converters and four correcting sections that respectively correct the frequency characteristics of the four AD converters, when supplied with an input signal having a single frequency. FIG. 11 shows the result of a simulation of a frequency characteristic of an output signal output by the AD converting apparatus 10 according to the modification shown in FIG. 7, when supplied with an input signal having a single frequency.

As shown in FIGS. 9, 10, and 11, each output signal output from an AD converting apparatus includes a main signal component of the input signal at a frequency position corresponding to the frequency of the input signal, i.e. a position near the frequency 0 in FIGS. 9 to 11. Furthermore, these output signals include an oversampling or undersampling component of the input signal at a frequency position at a distance of n times the sampling frequency Fs (where n is an integer) from the frequency of the input signal, i.e. a position at a frequency around 4000 in FIGS. 9 to 11.

The output signal shown in FIG. 9 includes a plurality of spurious components at substantially every quarter frequency of the sampling frequency Fs, i.e. frequencies of Fs/4. This output signal also includes aliases of the spurious components over the entire band. Accordingly, the output signal shown in FIG. 9 has a narrow dynamic range due to the effect of the spurious components and aliases.

The output signal shown in FIG. 10 includes a plurality of spurious components and aliases of these spurious components. However, the spurious components in this output signal are suppressed more than those in the output signal shown in FIG. 9, and therefore the output signal of FIG. 10 has a wide dynamic range.

The output signal of the AD converting apparatus 10 according to the present modification, as shown in FIG. 11, does not include spurious components or aliases. Therefore, the output signal of the AD converting apparatus 10 according to the present modification has a wider dynamic range than the output signals shown in FIGS. 9 and 10.

Figure 12:
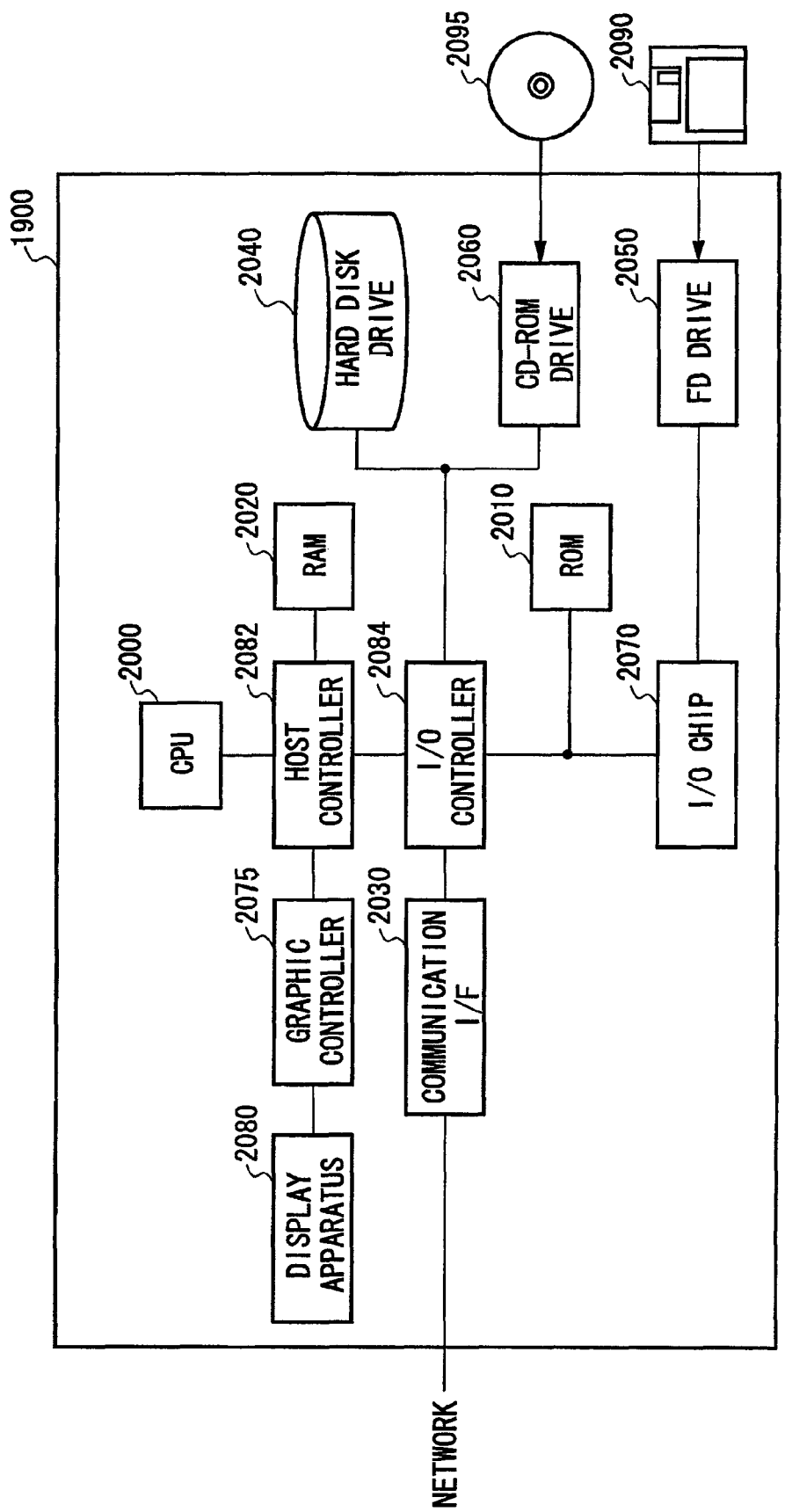
FIG. 12 shows an example of a hardware configuration of a computer 1900 according to the present embodiment.

FIG. 12 shows an example of a hardware configuration of a computer 1900 according to the present embodiment. The computer 1900 according to the present embodiment is provided with a CPU peripheral including a CPU 2000, a RAM 2020, a graphic controller 2075, and a displaying apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the displaying apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 to make the computer 1900 function as a control apparatus of a plurality of AD converters 20 are provided with a plurality of amplitude-dependent characteristic correcting modules, a combining module, a clock output module, and a measuring module. These programs and modules prompt the CPU 2000 or the like to make the computer 1900 function as the plurality of amplitude-dependent characteristic correcting sections 22, the combining section 24, the clock output section 26, and the measuring section 28. The programs installed in the computer 1900 to make the computer 1900 function as a control apparatus of a plurality of AD converters 20 may be further provided with a frequency-dependent characteristic correcting module. In this case, these programs and modules prompt the CPU 2000 or the like to make the computer 1900 function as the plurality of frequency-dependent characteristic correcting sections 60.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An AD converting apparatus that converts an analog input signal into a digital output signal, comprising:
   a plurality of AD converters supplied with sampling clocks differing from each other by prescribed phase amounts, each AD converter outputting an individual signal obtained by digitizing the input signal according to the supplied sampling clock;
   a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and
   a combining section that generates the output signal by combining a plurality of the corrected individual signals, wherein
   each amplitude-dependent characteristic correcting section corrects the individual signal output by the corresponding AD converter such that the corrected individual signal approximates a prescribed value, and
   each amplitude-dependent characteristic correcting section generates the corrected individual signal by multiplying the individual signal by the correction factor, which corresponds to an inverse of a characteristic representing a ratio of (i) the individual signal output by the corresponding AD converter to (ii) a signal expected to be output from a reference AD converter.

2. The AD converting apparatus according to Claim 1, further comprising a measuring section that measures a characteristic of an individual signal output by a certain AD converter at each amplitude of the input signal, and generates the correction factor for the certain AD converter based on a result of the measurement.

3. An AD converting apparatus that converts an analog input signal into a digital output signal, comprising:
   a plurality of AD converters supplied with sampling clocks differing from each other by prescribed phase amounts, each AD converter outputting an individual signal obtained by digitizing the input signal according to the supplied sampling clock;
   a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and
   a combining section that generates the output signal by combining a plurality of the corrected individual signals, wherein
   each amplitude-dependent characteristic correcting section includes:
      a complex conversion section that converts the individual signal output by the corresponding AD converter into a complex individual signal expressed as a complex number;
      a complex correcting section that generates a complex corrected individual signal by correcting the complex individual signal using the correction factor expressed as a complex number; and
      a real conversion section that converts the complex corrected individual signal into the corrected individual signal expressed as a real number.

4. The AD converting apparatus according to claim 3, wherein each complex correcting section includes:
   a factor output section that outputs, according to an amplitude of the individual signal output by the corresponding AD converter, the correction factor corresponding to an inverse of a characteristic representing a ratio of (i) a phase and an amplitude of the complex individual signal obtained by performing the complex conversion on the individual signal output by the corresponding AD converter to (ii) a phase and an amplitude of a signal obtained by performing the complex conversion on an individual signal expected to be output by a reference AD converter; and
   a complex multiplying section that outputs the complex corrected individual signal obtained as the result of a complex multiplication between the complex individual signal and the correction factor.

5. The AD converting apparatus according to claim 4, wherein
   each complex correcting section includes a table that stores the correction value for each amplitude of the individual signal, and
   each factor output section reads, from the table in the corresponding complex correcting section, the correction factor corresponding to the amplitude of the individual signal output by the corresponding AD converter, and supplies the read correction factor to the complex multiplying section.

6. An AD converting apparatus that converts an analog input signal into a digital output signal, comprising:
   a plurality of AD converters supplied with sampling clocks differing from each other by prescribed phase amounts, each AD converter outputting an individual signal obtained by digitizing the input signal according to the supplied sampling clock;
   a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal;
   a plurality of frequency-dependent characteristic correcting sections that are provided to correspond to the plurality of AD converters, each frequency-dependent characteristic correcting section correcting the individual signal output by the corresponding AD converter according to a frequency characteristic of the corresponding AD converter; and a combining section that generates the output signal by combining a plurality of the corrected individual signals.

7. The AD converting apparatus according to claim 6, wherein
each frequency-dependent characteristic correcting section corrects the corrected individual signal generated by the corresponding amplitude-dependent characteristic correcting section, according to the frequency characteristic of the corresponding AD converter, and
the combining section generates the output signal by combining the plurality of corrected individual signals generated by the plurality of frequency-dependent characteristic correcting sections, instead of the plurality of corrected individual signals generated by the plurality of amplitude-dependent characteristic correcting sections.

8. An AD converting method that uses a plurality of AD converters to convert an analog input signal into a digital output signal, comprising:
supplying the plurality of AD converters with sampling clocks differing from each other by prescribed phase amounts, and causing each AD converter to output an individual signal obtained by digitizing the input signal according to the supplied sampling clock;
generating a corrected individual signal for each AD converter by correcting the individual signal output by the AD converter using a correction factor corresponding to an amplitude of the individual signal such that the corrected individual signal approximates a prescribed value, wherein the corrected individual signal for each AD converter is generated by multiplying the individual signal output by the AD converter by the correction factor and the correction factor corresponds to an inverse of a characteristic representing a ratio of (i) the individual signal output by the AD converter to (ii) a signal expected to be output from a reference AD converter; and
generating the output signal by combining a plurality of the generated corrected individual signals.

9. A control apparatus that uses a plurality of AD converters to function as an AD converting apparatus that converts an analog input signal into a digital output signal, comprising:
a clock output section that supplies the plurality of AD converters with sampling clocks differing from each other by prescribed phase amounts, causing each AD converter to output an individual signal obtained by digitizing the input signal according to the supplied sampling clock;
a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and
a combining section that generates the output signal by combining a plurality of the corrected individual signals, wherein
each amplitude-dependent characteristic correcting section corrects the individual signal output by the corresponding AD converter such that the corrected individual signal approximates a prescribed value, and
each amplitude-dependent characteristic correcting section generates the corrected individual signal by multiplying the individual signal by the correction factor, which corresponds to an inverse of a characteristic representing a ratio of (i) the individual signal output by the corresponding AD converter to (ii) a signal expected to be output from a reference AD converter.

10. A computer readable medium storing thereon a program that causes a control apparatus to function as an AD converting apparatus that uses a plurality of AD converters to convert an analog input signal into a digital output signal, the program causing the control apparatus to function as:
a clock output section that supplies the plurality of AD converters with sampling clocks differing from each other by prescribed phase amounts, causing each AD converter to output an individual signal obtained by digitizing the input signal according to the supplied sampling clock;
a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and
a combining section that generates the output signal by combining a plurality of the corrected individual signals, wherein
each amplitude-dependent characteristic correcting section corrects the individual signal output by the corresponding AD converter such that the corrected individual signal approximates a prescribed value, and
each amplitude-dependent characteristic correcting section generates the corrected individual signal by multiplying the individual signal by the correction factor, which corresponds to an inverse of a characteristic representing a ratio of (i) the individual signal output by the corresponding AD converter to (ii) a signal expected to be output from a reference AD converter.

11. An AD converting method that uses a plurality of AD converters to convert an analog input signal into a digital output signal, comprising:
supplying the plurality of AD converters with sampling clocks differing from each other by prescribed phase amounts, and causing each AD converter to output an individual signal obtained by digitizing the input signal according to the supplied sampling clock;
generating a corrected individual signal for each AD converter by correcting the individual signal output by the AD converter using a correction factor corresponding to an amplitude of the individual signal; and
generating the output signal by combining a plurality of the generated corrected individual signals, wherein
said generating a corrected individual signal for each AD converter includes:
converting the individual signal output by each AD converter into a complex individual signal expressed as a complex number;
generating a complex corrected individual signal by correcting the complex individual signal using the correction factor expressed as a complex number; and
converting the complex corrected individual signal into the corrected individual signal expressed as a real number.

12. An AD converting method that uses a plurality of AD converters to convert an analog input signal into a digital output signal, comprising:
supplying the plurality of AD converters with sampling clocks differing from each other by prescribed phase amounts, and causing each AD converter to output an individual signal obtained by digitizing the input signal according to the supplied sampling clock;

generating a corrected individual signal for each AD converter by correcting the individual signal output by the AD converter using a correction factor corresponding to an amplitude of the individual signal;

correcting the individual signal output by each AD converter according to a frequency characteristic of the AD converter; and generating the output signal by combining a plurality of the generated corrected individual signals.

13. A control apparatus that uses a plurality of AD converters to function as an AD converting apparatus that converts an analog input signal into a digital output signal, comprising:

a clock output section that supplies the plurality of AD converters with sampling clocks differing from each other by prescribed phase amounts, causing each AD converter to output an individual signal obtained by digitizing the input signal according to the supplied sampling clock;

a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and a combining section that generates the output signal by combining a plurality of the corrected individual signals, wherein each amplitude-dependent characteristic correcting section includes:

a complex conversion section that converts the individual signal output by the corresponding AD converter into a complex individual signal expressed as a complex number;

a complex correcting section that generates a complex corrected individual signal by correcting the complex individual signal using the correction factor expressed as a complex number; and a real conversion section that converts the complex corrected individual signal into the corrected individual signal expressed as a real number.

14. A control apparatus that uses a plurality of AD converters to function as an AD converting apparatus that converts an analog input signal into a digital output signal, comprising:

a clock output section that supplies the plurality of AD converters with sampling clocks differing from each other by prescribed phase amounts, causing each AD converter to output an individual signal obtained by digitizing the input signal according to the supplied sampling clock;

a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal;

a plurality of frequency-dependent characteristic correcting sections that are provided to correspond to the plurality of AD converters, each frequency-dependent characteristic correcting section correcting the individual signal output by the corresponding AD converter according to a frequency characteristic of the corresponding AD converter; and a combining section that generates the output signal by combining a plurality of the corrected individual signals.

15. A computer readable medium storing thereon a program that causes a control apparatus to function as an AD converting apparatus that uses a plurality of AD converters to convert an analog input signal into a digital output signal, the program causing the control apparatus to function as:

a clock output section that supplies the plurality of AD converters with sampling clocks differing from each other by prescribed phase amounts, causing each AD converter to output an individual signal obtained by digitizing the input signal according to the supplied sampling clock;

a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal; and a combining section that generates the output signal by combining a plurality of the corrected individual signals, wherein each amplitude-dependent characteristic correcting section includes:

a complex conversion section that converts the individual signal output by the corresponding AD converter into a complex individual signal expressed as a complex number;

a complex correcting section that generates a complex corrected individual signal by correcting the complex individual signal using the correction factor expressed as a complex number; and a real conversion section that converts the complex corrected individual signal into the corrected individual signal expressed as a real number.

16. A computer readable medium storing thereon a program that causes a control apparatus to function as an AD converting apparatus that uses a plurality of AD converters to convert an analog input signal into a digital output signal, the program causing the control apparatus to function as:

a clock output section that supplies the plurality of AD converters with sampling clocks differing from each other by prescribed phase amounts, causing each AD converter to output an individual signal obtained by digitizing the input signal according to the supplied sampling clock;

a plurality of amplitude-dependent characteristic correcting sections that are provided to correspond to the plurality of AD converters, each amplitude-dependent characteristic correcting section generating a corrected individual signal by correcting the individual signal output by the corresponding AD converter using a correction factor corresponding to an amplitude of the individual signal;

a plurality of frequency-dependent characteristic correcting sections that are provided to correspond to the plurality of AD converters, each frequency-dependent characteristic correcting section correcting the individual signal output by the corresponding AD converter according to a frequency characteristic of the corresponding AD converter; and a combining section that generates the output signal by combining a plurality of the corrected individual signals.

* * * * *